(12) United States Patent
Numoto

(10) Patent No.: US 6,283,828 B1
(45) Date of Patent: Sep. 4, 2001

(54) WAFER POLISHING APPARATUS

(75) Inventor: Minoru Numoto, Mitaka (JP)

(73) Assignee: Tokyo Seimitsu Co., Ltd., Mitaka (JP)

( * ) Notice: Subject to any disclaimer, the term of this patent is extended or adjusted under 35 U.S.C. 154(b) by 0 days.

(21) Appl. No.: 09/433,310

(22) Filed: Nov. 3, 1999

(30) Foreign Application Priority Data

| Nov. 9, 1998 | (JP) | 10-317907 |
| Nov. 9, 1998 | (JP) | 10-317908 |
| Apr. 20, 1999 | (JP) | 11-111898 |
| Oct. 8, 1999 | (JP) | 11-288562 |

(51) Int. Cl.$^7$ ............................. B24B 49/00; B24B 51/00
(52) U.S. Cl. ............................. 451/8; 451/288; 451/287
(58) Field of Search ............................. 451/5, 6, 8, 9, 451/41, 63, 287, 288, 397, 398, 364

(56) References Cited

FOREIGN PATENT DOCUMENTS

| 0 776 730 | 6/1997 | (EP) . |
| 0 790 100 | 8/1997 | (EP) . |
| 0 861 706 | 9/1998 | (EP) . |
| 0 870 576 | 10/1998 | (EP) . |
| 2 298 960 | 9/1996 | (GB) . |
| 2 315 694 | 2/1998 | (GB) . |
| 63-288660 | 11/1988 | (JP) . |
| 9-19863 | 1/1997 | (JP) . |
| 10-235554 | 9/1998 | (JP) . |
| 10-256209 | 9/1998 | (JP) . |
| 11-33902 | 2/1999 | (JP) . |
| 11-42555 | 2/1999 | (JP) . |
| WO 98/21008 | 5/1998 | (WO) . |
| WO 99/33614 | 7/1999 | (WO) . |

*Primary Examiner*—Derris H. Banks
(74) *Attorney, Agent, or Firm*—Nixon Peabody LLP; David S. Safran

(57) ABSTRACT

The present invention is a wafer polishing apparatus with a device that detects the polishing end according to a change in rotation resistance of a wafer during polishing. The wafer polishing apparatus comprises a head body and a carrier which are connected with each other by a connecting bar which is provided with a strain gage, and determines strain in a horizontal direction of the connecting bar by the strain gage so as to determine a rotation torque of the carrier, whereby accurately detects the polishing end. Since a retainer ring is mounted to the outer periphery of the carrier via an O ring, the impact at contacting of the wafer with the retainer ring can be absorbed by the O ring, thus the wafer is prevented from damage. Because the retainer ring is mounted to the carrier without a gap, the outer periphery of the wafer is enclosed by the retainer ring, and the wafer can be polished in a state where its center is held on the central axis of the carrier. Therefore, the polishing precision of the wafer can be improved.

10 Claims, 9 Drawing Sheets

F I G. 6
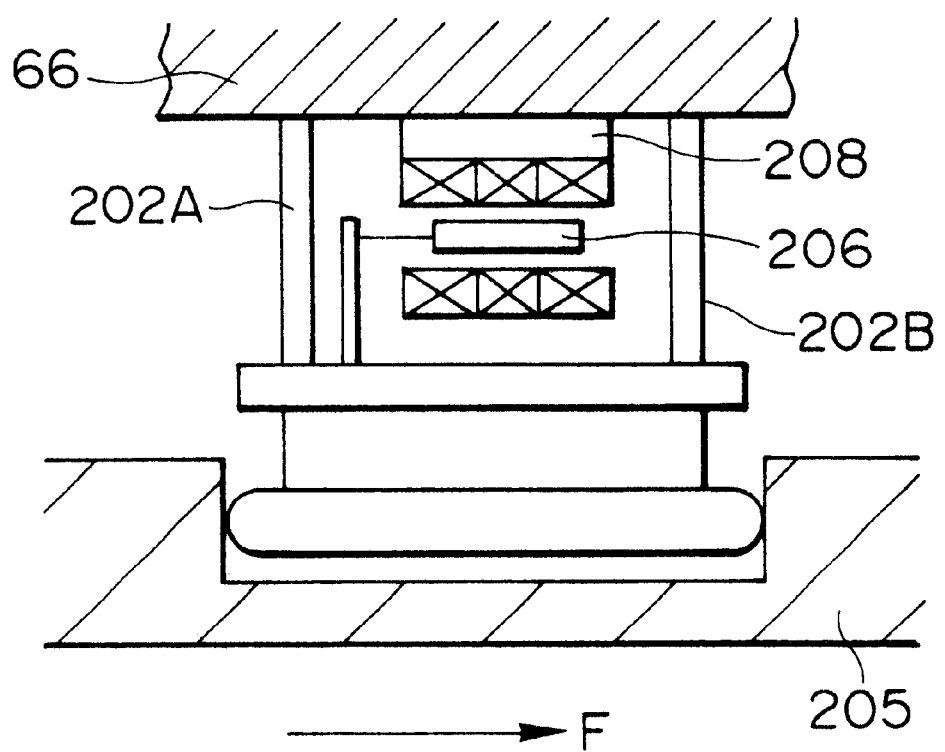

DETECTED SIGNAL

WAFER POLISHING APPARATUS

BACKGROUND OF THE INVENTION

1. Field of the Invention

The present invention relates generally to a wafer polishing apparatus, and more particularly to a wafer polishing apparatus with a chemical mechanical polishing method (CMP).

2. Description of Related Art

A wafer polishing apparatus with a CMP polishes an oxidized membrane and a metal membrane, and so forth, which are formed on a wafer, and such a polishing apparatus requires a precise control of a polishing amount. Thus, as an apparatus for controlling the polishing amount, that is, as an apparatus for detecting an end of the polishing, an apparatus is suggested which determines a rotation torque of a wafer holding head and then detects the end of the polishing according to the rotation torque.

As shown in FIG. 4, the apparatus for detecting the end of the polishing detects, focussing on a difference in rotation resistance (processing resistance) which occurs due to different processing resistances at layers and different types of polishing liquids (slurries), the change in the processing resistance and finishes processing at an intended layer. The relationship between the each layer and the rotation resistance is "metal layer"<"membrane between layers"<"barrier metal layer".

However, because the apparatus for determining the rotation torque of the wafer holding head according to a change in electrical resistance of a motor determines the rotation torque including the rotation resistance of a deceleration mechanism connecting an output shaft of the motor and the wafer holding head, the rotation torque of only the wafer holding head cannot be determined exclusively; thus the end of the polishing cannot be detected accurately.

A wafer polishing apparatus disclosed in Japanese Patent Application Laid-open No. 9-19863 forms a pressurized air layer between a carrier and a wafer, and presses the wafer against a platen through the pressurized air layer to polish the wafer. Moreover, according to the wafer polishing apparatus, a retainer ring is arranged at an outer periphery of the carrier; thus, the retainer ring prevents the wafer from jumping out of the carrier during polishing. In other words, the outer periphery of the wafer during polishing is contacted with an inner periphery of the retainer ring whereby preventing the wafer from jumping out of the carrier.

Directed to a case in which the retainer ring is directly fixed to the outer periphery of the carrier, an impact at contact of the wafer to the retainer ring is not absorbed to the retainer ring side, and such an impact rather becomes a counterforce applied to the wafer; as a result a wafer may be damaged.

In view of the above-described adverse effect, the wafer polishing apparatus has the retainer ring arranged with a gap with respect to the outer periphery of the carrier, so as to prevent the wafer from a damage by absorbing the impact with the gap.

Further, the wafer polishing apparatus has the retainer ring arranged with the gap with respect to the carrier; thus the wafer is polished, its position with respect to the carrier always moving.

In the wafer polishing apparatus, the wafer is polished preferably in a state that the center of the wafer is held on the central axis of the carrier in purpose of improving the polishing precision of the wafer.

However, the conventional wafer polishing apparatus has a difficulty in improving its polishing precision of the wafer since the position of the wafer always changes.

This problem can be solved by fixing the retainer ring directly to the outer periphery of the carrier and polishing the wafer without the gap, but the wafer may be damaged without the gap as described above.

SUMMARY OF THE INVENTION

The present invention has been developed in view of the above-described circumstances, and has as its object the provision of a wafer polishing apparatus with a detecting device which accurately detects the end of the polishing according to the change in a rotation resistance of the wafer during polishing.

Further object of the present invention is the provision of the wafer polishing apparatus, which can prevent damage of the wafer which occurs by the impact at contact of the wafer with a retainer ring, while improving the polishing precision by polishing the wafer in the state that the center of the wafer is held on the central axis of the carrier.

To achieve the above-mentioned object, the present invention is directed to a wafer polishing apparatus, comprising: a platen which rotates; a holding head which holds a wafer and presses the wafer against the platen to polish the wafer, the holding head comprising a head body which is rotated and arranged to face the platen, a carrier which is arranged below the head body and holds the wafer at its bottom face, a connecting member which connects the head body with the carrier and transmits a rotation force from the head body to the carrier, and a torque determining device which is provided to the connecting member and determines a rotation torque of the carrier applied from the carrier to the connecting member; and a polishing amount determining device which determines a polishing amount of the wafer according to the rotation torque determined by the torque determining device.

Moreover, to achieve the above-mentioned object, the present invention is directed to a wafer polishing apparatus, comprising: a platen which rotates; a holding head which holds a wafer and presses the wafer against the platen to polish the wafer, the holding head comprising a head body which is rotated and arranged to face the platen, a carrier which is arranged below the head body and holds the wafer at its bottom face, a connecting member which connects the head body with the carrier and transmits a rotation force from the head body to the carrier, and a friction force determining device which is provided to the connecting member and determines a friction force in a rotation direction of the platen which occurs at the wafer and the platen and is applied from the carrier to the connecting member; and a controller which controls wafer polishing according to a change in the friction force determined by the friction force determining device.

According to the present invention, the head body and the carrier constituting the holding head are connected with each other by the connecting member which comprises a torque determining device which determines only a rotation torque of the carrier; thus a polishing end can be accurately detected.

Further, according to the present invention, a strain measuring device for measuring the strain of the connecting member is applied as the torque determining device. The processor calculates the rotation torque of the carrier according to the strain measured by the strain measuring device. Therefore, the accurate rotation torque of the carrier can be obtained.

According to the present invention, a strain gage is applied as the strain measuring device of the torque determining device, so that the rotation torque of the carrier can be easily determined. In that case, the processor calculates the rotation torque of the carrier according to an electric signal outputted from the strain gage.

Still according to the present invention, the head body and the carrier of the holding head are connected with each other by the; connecting member which is provided with a friction force determining device. The friction force determining device determines the friction force in a rotation direction of the platen, which occurs by the wafer and the platen, and the controller controls wafer polishing according to the friction force.

In wafer polishing by CMP, a friction coefficient of the wafer and the platen changes when a dressing condition of the platen is poor and a polishing rate drops. The friction coefficient tends to be low when the polishing rate is high, and tends to be high when the polishing rate drops. Therefore, the present invention for detecting the change in the friction coefficient, that is, change in the friction force, stores beforehand the friction force indicating when the platen needs to be dressed, and the friction force indicating the platen needs to be replaced; thereby the polishing apparatus can automatically determine the time for dressing and replacement of the platen.

The present invention applies parallel springs as the connecting member, and applies as the friction force determining device for determining the displacement between the parallel springs. The friction force caused by the wafer and the platen is calculated by the processor according to the displacement of the parallel springs; thus, the friction force can be obtained easily with a simple structure.

The present invention applies a member to deform elastically by the friction force, and applies as the friction force determining device for determining an amount of elastic deformation of the member. The friction force caused by the wafer and the platen is calculated by the processor according to the amount of elastic deformation of the member; thus the friction force can be obtained easily with a simple structure.

The present invention applies a differential transformer as the determining device so that the displacement between the parallel springs can be easily determined, and thus the friction force can be easily obtained.

According to the present invention, the connecting member is arranged on the central axis of the head body and the carrier, so that the friction force in the rotational direction of the rotation torque of the carrier, or the platen can be received on the central axis of the holding head. Therefore, the torque detecting mechanism in a smaller size is possible than the one in a case to transmit the rotation torque with the outer periphery of the holding head. In addition, because the pressing force and the rotation resistance can be separated, the friction force can be accurately determined.

Further, to achieve the above-mentioned object, the present invention is directed to a wafer polishing apparatus, comprising: a platen which rotates; and a holding head which holds a wafer and presses the wafer against the platen to polish an obverse of the wafer, the holding head comprising a head body which is rotated and arranged to face the platen, a carrier which is supported to the head body to be movable vertically, an air blowing member which is provided at a bottom face of the carrier and blows air toward a reverse of the wafer to form a pressurized air layer between the carrier and the wafer, a pressing device which presses the carrier toward the platen to press the wafer against the platen through the pressurized air layer, and a retainer ring which is mounted on an outer periphery of the carrier via a buffer member and pressed against the platen during polishing the wafer to prevent the wafer from jumping out of the carrier while enclosing the wafer to hold a center of the wafer on a central axis of the carrier.

According to the present invention, the retainer ring is mounted to the outer periphery of the carrier via the buffer member, so that the impact at contact of the wafer with the retainer ring is absorbed by the buffer member. According to the present invention, the retainer ring is mounted to the carrier without a gap; thus the wafer can be polished in a state where the outer periphery of the wafer is enclosed by the retainer ring and the center of the wafer is held on the central axis of the carrier. Therefore, polishing precision can be improved.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 6 is an explanatory view of a movement of a parallel spring which is attached to a wafer holding head in FIG. 5;

DETAILED DESCRIPTION OF THE PREFERRED EMBODIMENT

A description will hereunder be given of an embodiment of a polishing apparatus according to the present invention with the accompanying drawings.

Figure 1:
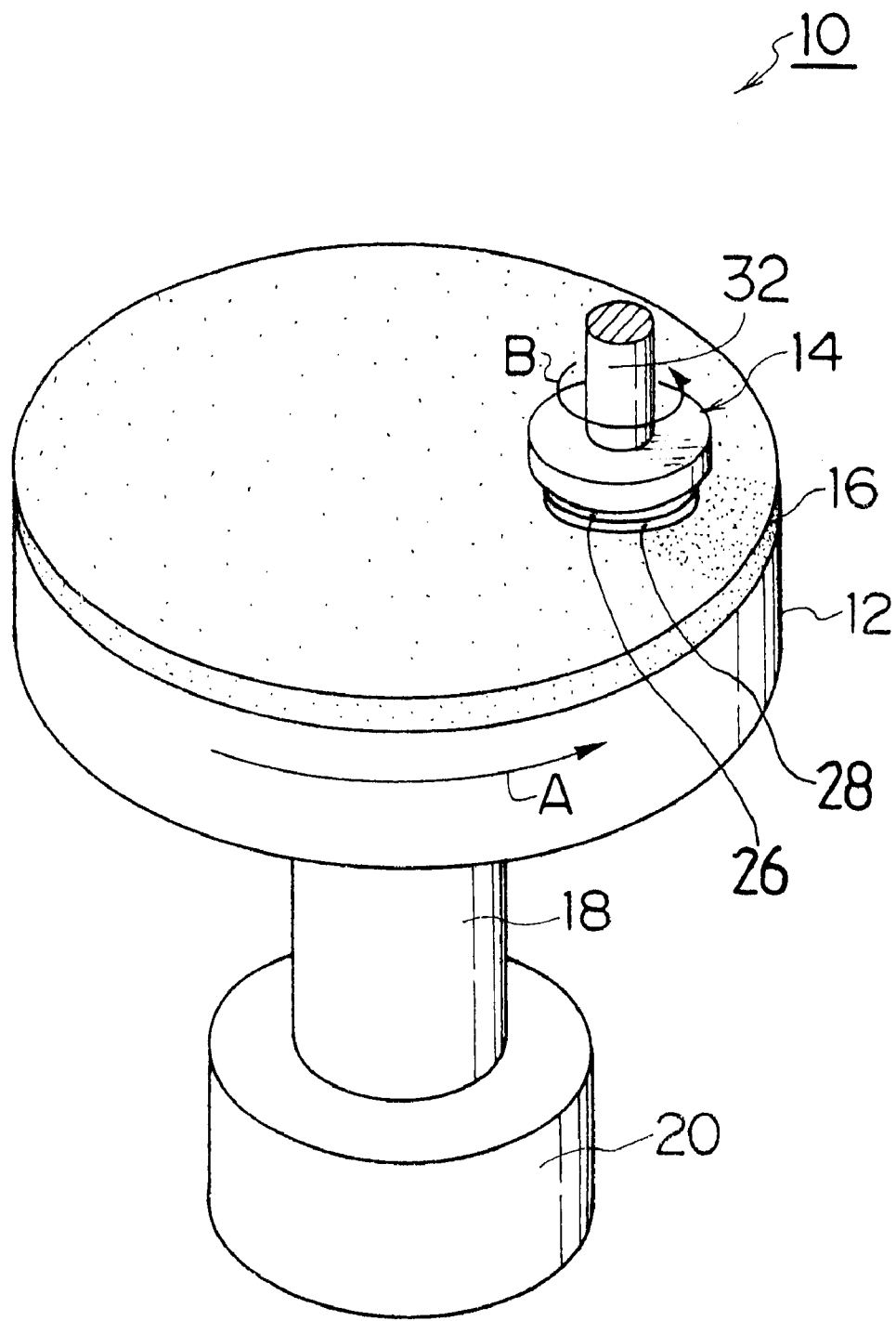
FIG. 1 is a view showing the entire structure of a wafer polishing apparatus in the first embodiment.

FIG. 1 is a view showing the entire structure of a wafer polishing apparatus 10 in the first embodiment.

The wafer polishing apparatus 10 in FIG. 1 comprises a platen 12 and a wafer holding head 14. The platen 12 is disk-shaped, and a polishing pad 16 is provided thereon. The lower portion of the platen 12 is also connected to a shaft 18 which is connected to an output shaft (not shown) of a motor 20. Thus, when driving the motor 20, the platen 12 is rotated in direction A in FIG. 1, and slurry is supplied on the polishing pad 16 of the rotating platen 12 from a nozzle (not shown).

Figure 2:
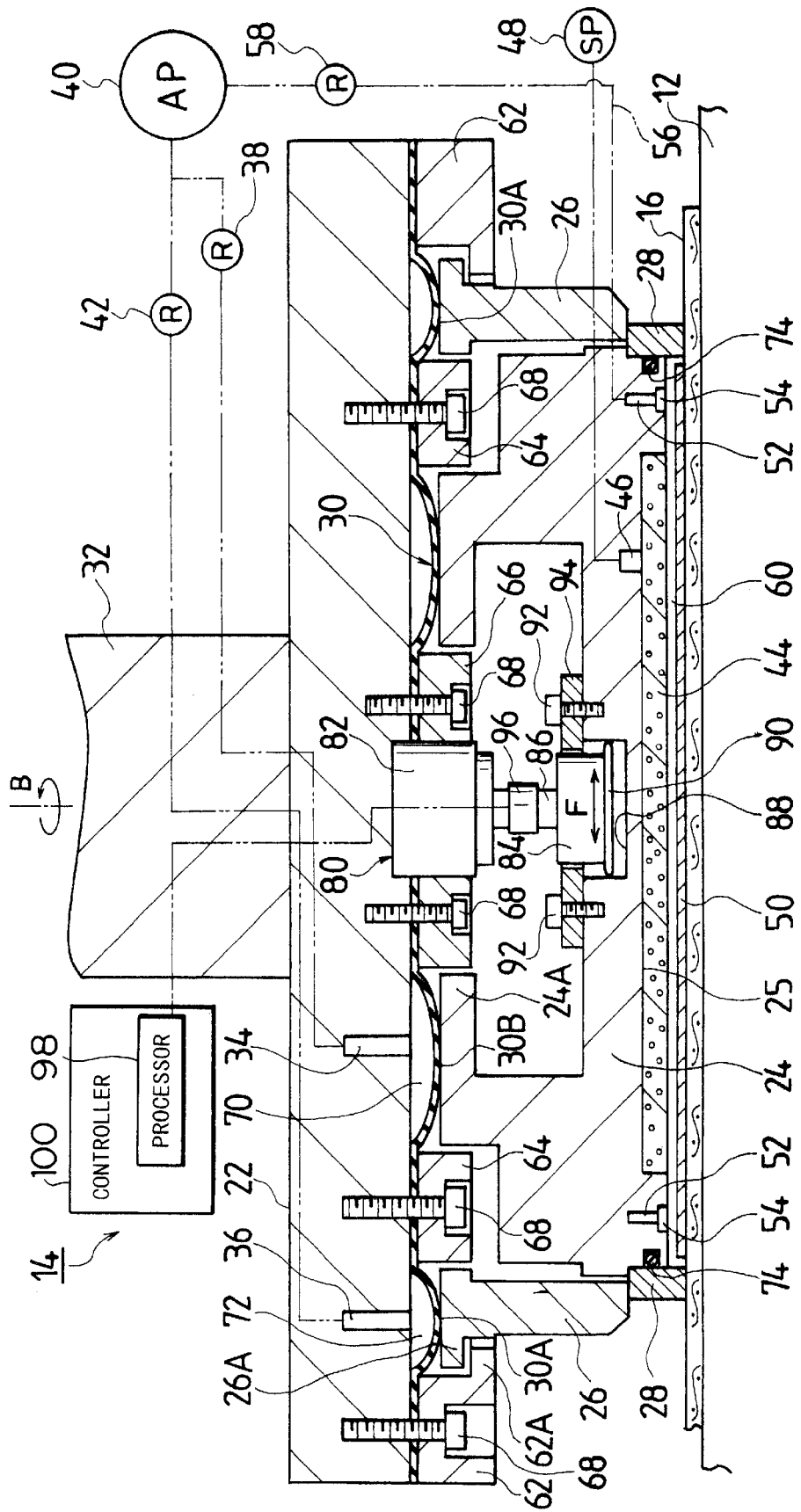
FIG. 2 is a longitudinal section view of a wafer holding head of the wafer polishing apparatus in FIG. 1.

FIG. 2 is a longitudinal section view of the wafer holding head 14. The wafer holding head 14 shown in FIG. 2 comprises a head body 22, a carrier 24, a guide ring 26, a retainer ring 28, a rubber sheet 30, and so forth.

The head body 22 is disk-shaped, and on its top a rotation axis 32 is fixed to be coaxial with its central axis. The rotation axis 32 is connected to an output shaft of a motor (not shown), and the driving force of the motor rotates the head body 22 in direction B in FIG. 2.

Air supply passages 34 and 36 are formed in the head body 22. As shown by an alternative two long and short dashes lines in FIG. 2, the air supply passage 34 is extended outside the wafer holding head 14, and is connected with an air pump 40 via a regulator 38. Similarly, the air supply passage 36 is also extended outside the wafer holding head 14, and is connected with the air pump 40 via a regulator 42.

The disk-shaped carrier 24 is arranged at the bottom of the head body 22 to be coaxial with the central axis of the head body 22. Moreover a concave portion 25 is formed at the bottom face of the carrier 24, and an air permeable porous board 44 is contained in the concave portion 25. The porous board 44 is connected to an air suction passage 46, and the air suction passage 46 is extended outside the wafer holding head 14 and connected with a suction pump 48. Thus, as the suction pump 48 is activated, the porous board 44 functions as a suction member, whereby the porous board 44 holds a wafer 50 by suction. The porous board 44 has a number of air passages therein, and a sintered body of a ceramic material is used for example.

The outer periphery of the bottom face of the carrier 24 has air jetting openings 52 formed concentrically with predetermined intervals. The air Jetting openings 52 are provided through to ring-shaped air grooves 54 formed at the bottom face of the carrier 24. The air jetting openings 52 are also connected to an air supply passage 56 which is shown with alternative long and two short dotted lines in FIG. 2. The air supply passage 56 is extended outside the wafer holding head 14, and is connected with the air pump 40 via a regulator 58.

Therefore, as the air pump 40 is activated, compressed air from the air pump 40 is jetted downward from the air grooves 54 through the air supply passage 56 and the air jetting openings 52. A pressurized air layer 60 is therefore formed between the bottom face of the carrier 24 and the reverse side of the wafer 50. The wafer 50 is pressed against the polishing pad 16 by the pressing force transmitted from the carrier 24 through the pressurized air layer 60 and polished.

The disk-shaped rubber sheet 30 with a uniform thickness is fixed to the bottom face of the head body 22 by ring-shaped fixing metals 62, 64, and 66 in large, medium, and small sizes by which the rubber sheet 30 is divided in two, an outer part 30A and an inner part 30B. The inner part 30B of the rubber sheet 30 divided as described above presses the carrier 24, and the outer part 30A presses the retainer ring 28 via the guide ring 26. Additionally, the reference numbers 68 are bolts for connecting the fixing metals 62, 64, and 66 with the head body 22.

Dividing the rubber sheet 30 in two as described above forms a ring-shaped space 70 which is sealed by the inner part 30B of the rubber sheet 30 and a ring-shaped space 72 which is sealed by the outer part 30A. Since the space 70 is connected to the air supply passage 34, the inner part 30B of the rubber sheet 30 is swollen by the air pressure when the compressed air from the air pump 40 is supplied from the air supply passage 34 to the space 70. Consequently, the carrier 24, which is positioned at the bottom of the inner part 30B, is pressed down by the swell of the inner part 30B. Then the pressure force is transmitted to the wafer 50 through the pressurized air layer 60, so pressing force of the wafer 50 against the polishing pad 16 can be obtained. Moreover, the pressing force of the wafer 50 against the polishing pad 16 can be controlled by adjusting the air pressure by the regulator 38.

On the other hand, the outer part 30A of the rubber sheet 30 can be swollen by the air pressure as the compressed air from the air pump 40 is supplied from the air supply passage 36 to the space 72 because the air supply passage 36 is connected to the space 72. Thus, the guide ring 26, positioned at the bottom of the outer part 30A, is pressed down by the outer part 30A, then the retainer ring 28, arranged at the bottom of the guide ring 26, is pressed against the polishing pad 16. Further, the pressing force of the retainer ring 28 can be controlled by adjusting the air pressure by the regulator 42. The pressing force of the retainer ring 28 is set to be the force in which stress from the polishing pad 16 does not concentrate on the edge of the wafer 50.

The cylindrical guide ring 26 is arranged at the bottom of the head body 22 to be coaxial with the central axis of the head body 22. A flange 26A is also formed at the upper periphery of the guide ring 26 which, as elevating the wafer holding head 14 from the polishing pad 16, contacts with a flange 62A formed at the lower periphery of the fixing metal 62. Thus the guide ring 26 is prevented from falling off the wafer holding head 14.

The retainer ring 28 is a ring for preventing the wafer 50 from falling off the wafer holding head 14 during polishing, and is mounted to the bottom outer periphery of the carrier 24 via an O ring 74. As explained above, by mounting the retainer ring 28 to the carrier 24 via the O ring 74, the O ring 74 absorbs the impact at contacting of the wafer 50 with the retainer ring 28. The wafer 50 can be set to the carrier 24 easily due to that the retainer ring 28 is held coaxially with the carrier 24.

Next, a polishing end detecting apparatus will be explained which is applied to the wafer holding head 14 in the present embodiment.

The polishing end detecting apparatus in the present embodiment is constructed considering the difference in the rotation torque of the carrier 24 by the difference in processing quality of the wafer 50. In other words, the polishing end detecting apparatus comprises a strain gage 96 for determining the rotation torque of the carrier 24 as strain, and a control device 100 (same as the polishing amount determining device) with a processor 98 for calculating the rotation torque according to an electric signal outputted from the strain gage 96.

The strain gage 96 is attached to a connecting bar 80 which is a member to suspend the carrier 24 to the head body 22 and is arranged to be coaxial with the central axis of the wafer holding head 14. The connecting bar 80 comprises a base 82, a connecting part 84, and a constricted part 86. The base 82 is fixed to the head body 22 by a bolt (not shown), and the connecting part 84 is inserted into a rectangular concave groove 88 which is formed on top of the carrier 24.

Figure 3:
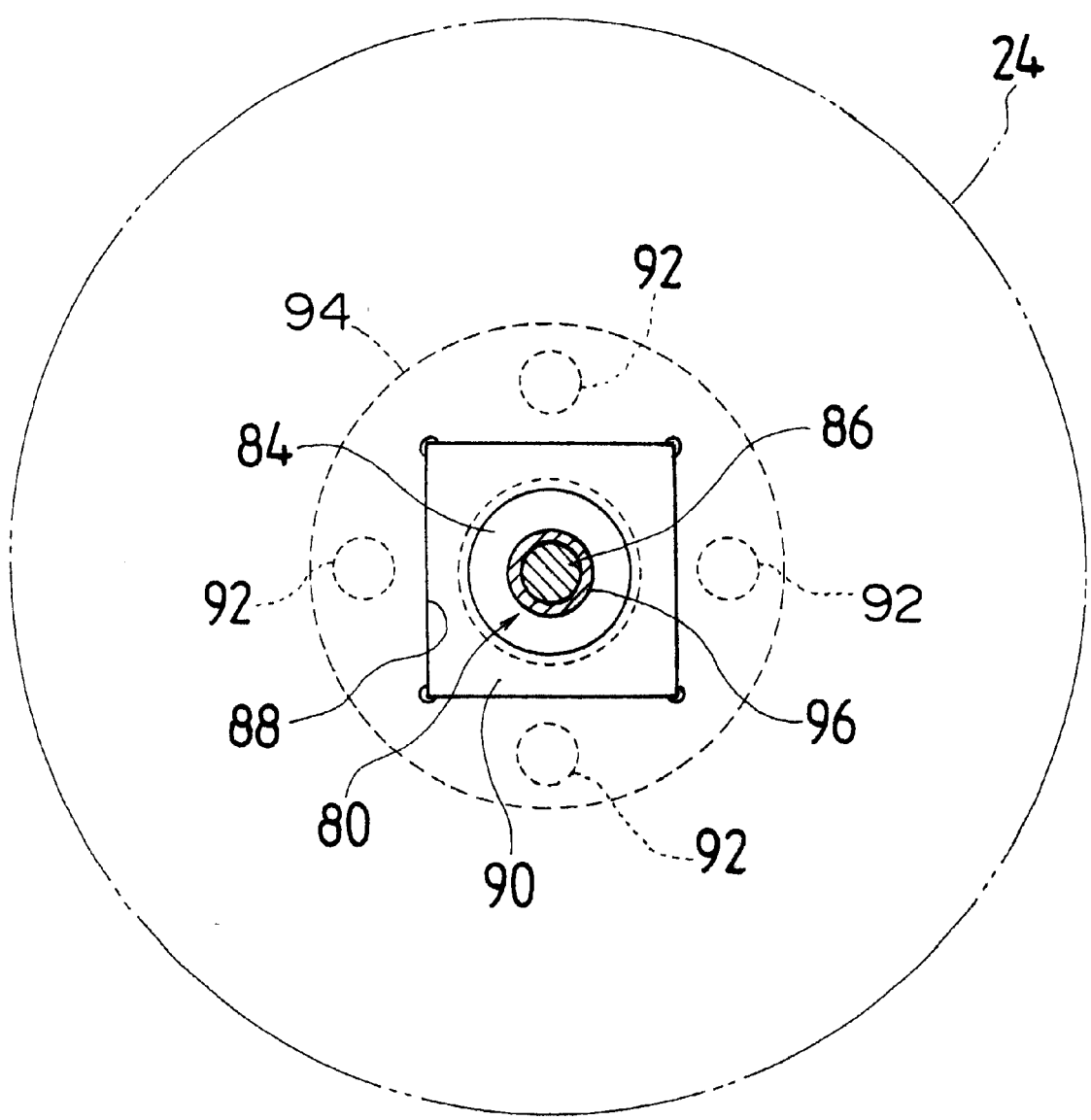
FIG. 3 is a plan view showing a position to attach a connecting bar with respect to a carrier.
Figure 4:
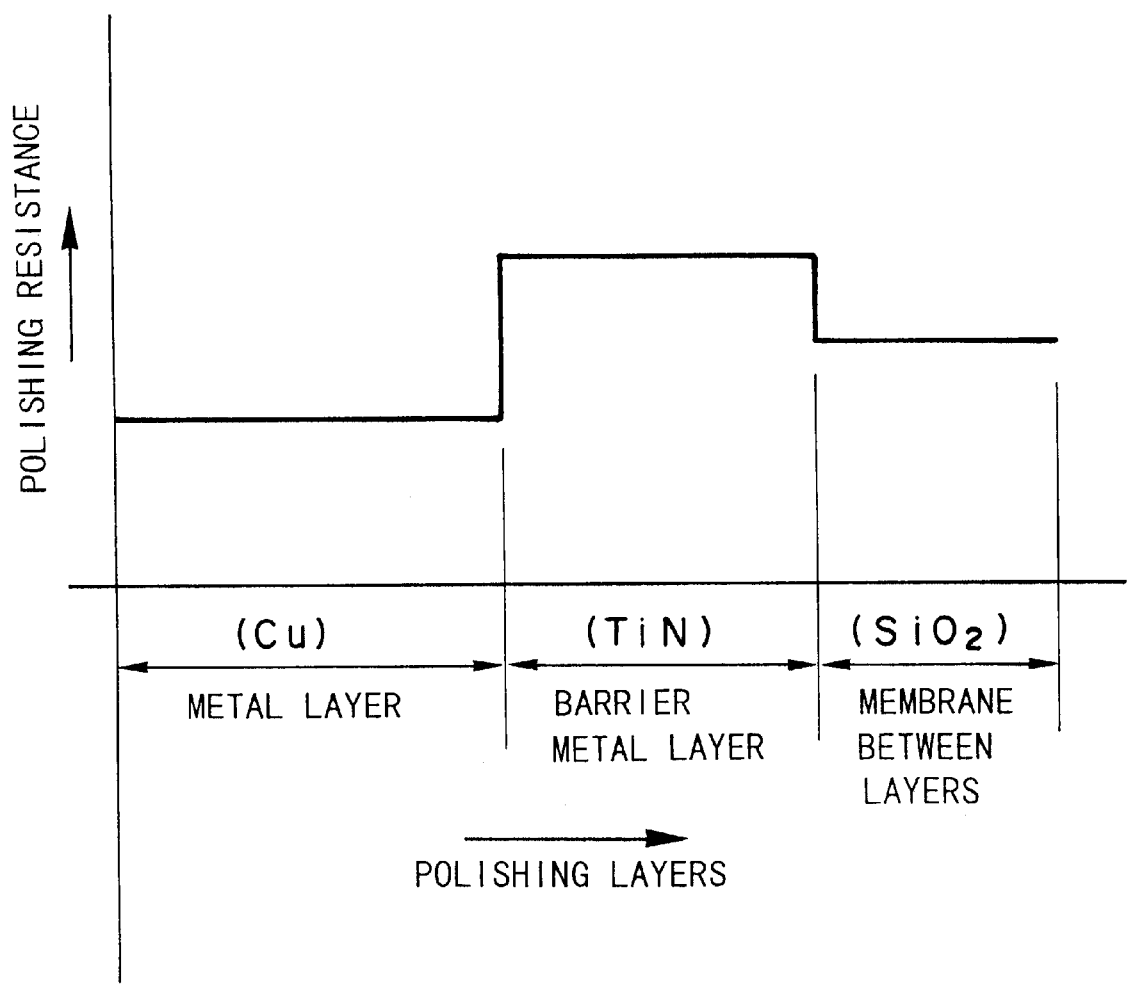
FIG. 4 is a graph indicating the relationship between a change in processing layer and a processing resistance of the wafer with respect to polishing time when polishing the wafer.

As shown in FIG. 3, the connecting part 84 has a rectangular flange 90 formed at its bottom, and the flange 90 is fit in the groove 88. Thus, the carrier 24 is connected in a state to be prevented from rotating with respect to the head body 22 while prevented from shaking. A ring 94 is fixed to the carrier 24 with bolts 92 to prevent the carrier 24 from coming off over the flange 90.

As shown in FIG. 2, the strain gage 96 is attached to the constricted part 86 of the connecting bar 80. The gage 96 measures the strain in twist (in a rotating direction) of the constricted part 86 as the electric signal, which is outputted to the processor 98 of the control device 100. The processor 98 calculates the rotation torque of the carrier 24 according to the electric signal outputted from the strain gage 96. Then the control device 100 controls the wafer polishing apparatus 10 to terminate polishing the wafer 50 as the rotation torque, calculated by the processor 98, changes to the rotation torque corresponding to the terminal material. The reference rotation torque is stored in a RAM (not shown) of the control device 100. The reference rotation torque is read out by the control device 100 at polishing, and is compared with an actual rotation torque.

As explained above, in order to determine the rotation torque of the carrier 24 accurately, the head body 22 and the carrier 24 are connected with each other by the connecting bar 80 which is provided with the strain gage 96, and the rotation torque of the carrier 24 is determined according to the electric signal outputted from the strain gage 96.

Thus, as compared with a polishing end detecting device that determines the rotation torque of the carrier 24 according to art electric resistance of a motor rotating the wafer holding head 14, the polishing end detecting device in the present embodiment can accurately determine the rotation torque, so that the polishing end of the wafer 50 can be detected accurately.

In addition, instead of the strain gage 96, any other determining device which can determine the rotation torque of the carrier 24, such as a piezoelectric sensor, may be used.

Further, in the present embodiment, a force F in the horizontal direction of the carrier 24 is received on the central axis of the wafer holding head 14; consequently, the freedom of the wafer holding head 14 as to inclination can be widened more than in a case when the force F is received by the outer periphery of the wafer holding head 14.

Now, an operation will be explained of the wafer holding head 14 of the wafer polishing apparatus 10 constructed as described above.

First, the wafer 50 to be polished is held by the porous board 44 and the wafer holding head 14 is moved to a predetermined position on the polishing pad 16.

Second, the wafer 50 is released from the porous board 44, and the wafer 50 is placed on the polishing pad 16.

Then, the air pump 40 is activated to jet the compressed air from the air supply passage 56 to between the carrier 24 and the wafer 50 through the air jetting openings 52 and the air grooves 54, and the pressurized air layer 60 is formed between the carrier 24 and the wafer 50.

After that, the compressed air from the air pump 40 is supplied to the space 70 through the air supply passage 34, and the inner part 30B of the rubber sheet 30 is swollen by the inner air pressure so as to press the carrier 24. By that process the wafer 50 is pressed against the polishing pad 16 by the pressure force of the carrier 24 which is transmitted through the pressurized air layer 60. Then, the air pressure is adjusted by the regulator 38 to control the inner air pressure to a desired pressure, and the pressing force of the wafer 50 against the polishing pad 16 is stabilized.

Following the above process, the compressed air from the air pump 44 is supplied to the space 72 through the air supply passage 36, and the retainer ring 28 is pressed via the guide ring 26 by swelling the outer part 30A of the rubber sheet 30 by the inner air pressure, so that the retainer ring 28 is pressed against the polishing pad 16. Then, the air pressure is adjusted by the regulator 42 to control the inner air pressure to the desired pressure, and the pressing force of the retainer ring 28 against the polishing pad 16 is maintained constant.

After that, the wafer holding head 14 and the platen 12 are rotated to start polishing the wafer 50.

During the polishing, the outer periphery of the wafer 50 contacts with the inner periphery of the retainer ring 28, so that the wafer 50 is polished in a state that it is prevented from jumping out of the wafer holding head 14. The impact at contact of the wafer 50 with the retainer ring 28 is absorbed by the deformation of the retainer ring 28 and the O ring 74. Therefore, according to the wafer holding head 14, the wafer 50 can be prevented from damage caused by the impact.

Moreover, the retainer ring 28 in the wafer holding head 14 is fixed to the carrier 24 without a gap, thereby the wafer is polished in a state that it is enclosed by the retainer ring 28. Therefore, according to the wafer holding head 14, the wafer 50 can be polished in a state that the center of the wafer 50 is held on the central axis of the carrier 24, so that the polishing precision of the wafer 50 can be improved.

On the other hand, the polishing amount of the wafer 50 during polishing is always determined by determining the rotation torque of the carrier 24 with the strain gage 96 and the control device 100. When the determined rotation torque is changed to be the rotation torque corresponding to the terminal material, the control device 100 controls the wafer polishing apparatus 10 and terminates polishing the wafer 50.

After that, the polished wafer 50 is held by the porous board 44, and transported to a cleaning apparatus of the next process by an unloading action of the wafer holding head 14. Then operation of the wafer holding head 14 is finished.

The present embodiment represents the explanation of an example in which the O ring 74 is applied as a buffer; however the invention is not limited to that. Any embodiment is possible in which a member is applied that can buff the impact at contact of the wafer 50 with the retainer ring 28.

Figure 5:
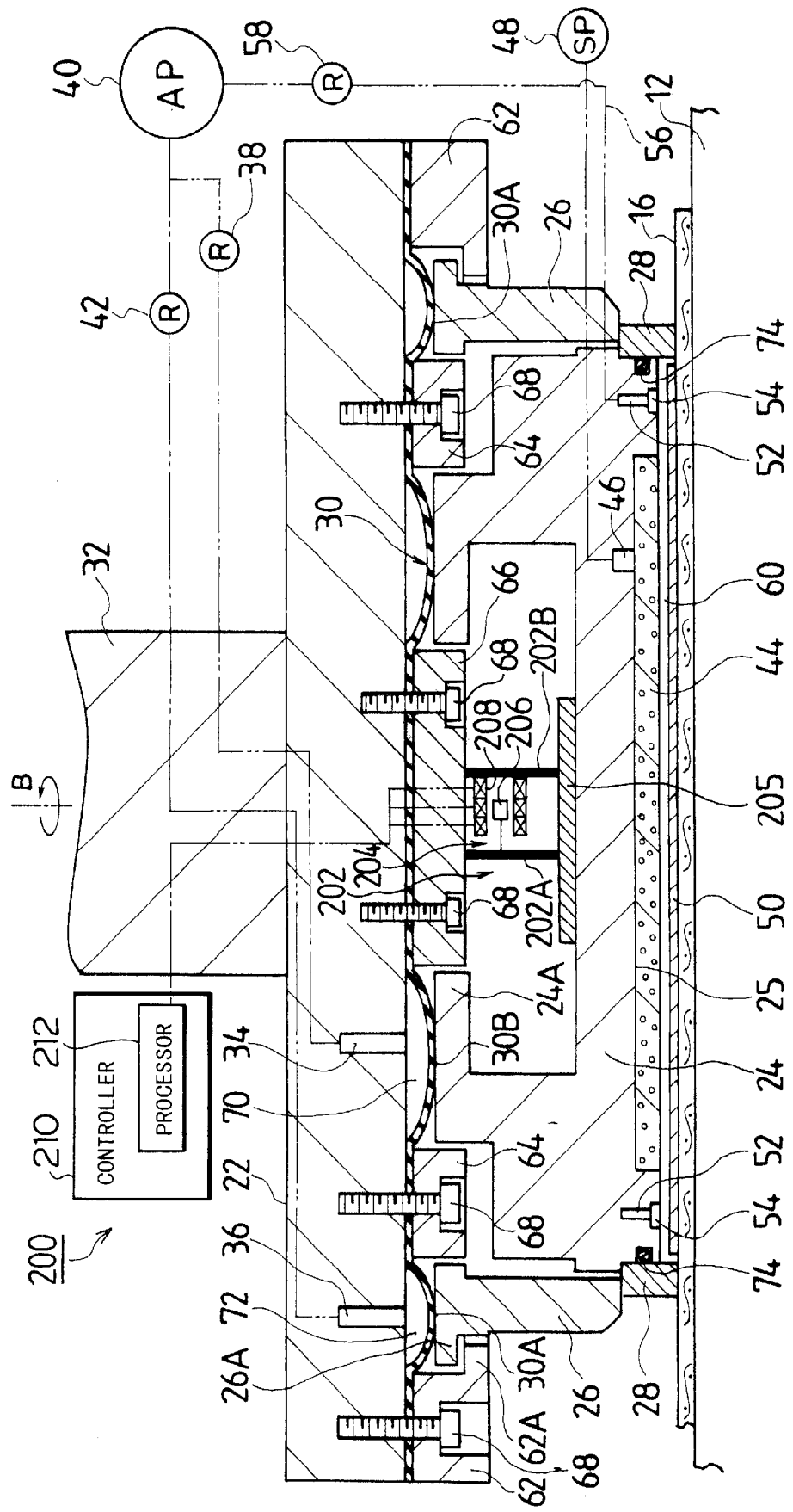
FIG. 5 is a longitudinal section view of a wafer holding head in the second embodiment.

FIG. 5 is a longitudinal section view of the wafer holding head 200 in the econd embodiment; the same or similar members as the wafer holding head 14 in the first embodiment are assigned the same numbers, and the explanation for them is omitted.

The wafer holding head 200 has the head body 22 and the carrier 24 connected with each other by parallel springs 202 between which a differential transformer 204 is attached. As shown in FIGS. 5 and 6, a core 206 of the differential transformer 204 is attached horizontally to a spring 202A, one of the parallel springs 202, and a bobbin 208 of the differential transformer 204 is attached horizontally to a spring 202B, another of the parallel springs 202. The top end portion of the parallel springs 202 is fixed to the fixing metal 66, and its bottom end portion is loosely fit and supported by a base plate 205 attached to the carrier 24.

An electric signal outputted from the differential transformer 202 is outputted to a control device 210 which is arranged outside the wafer holding head 200 shown in FIG. 5. The control device 210 has an amplifier (not shown) for amplifying the electric signal, and a processor 212 for calculating the friction force occurring at the wafer 50 and the polishing pad 16. The control device 210 also has a rectifier smoothing circuit (not shown) for rectifying the amplified electric signal.

Figure 7:
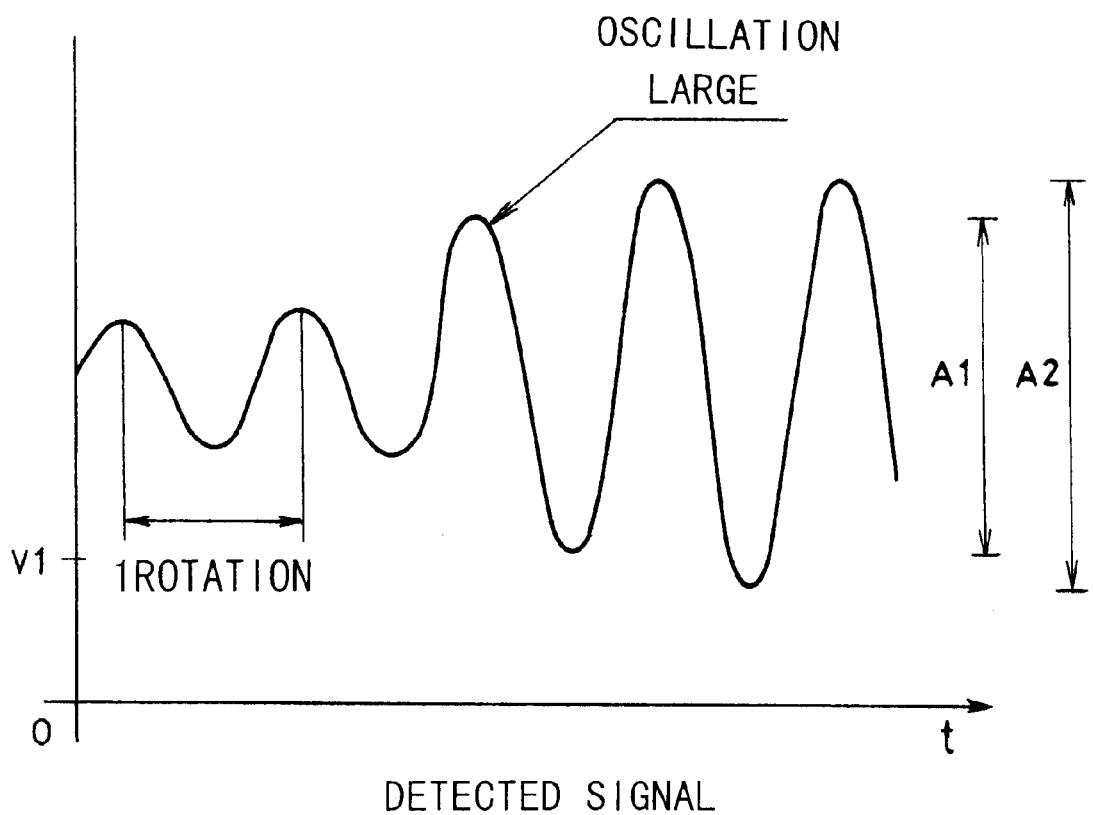
FIG. 7 is a view showing detection signals outputted from a differential transformer.

As the friction force (friction coefficient) occurring at the wafer 50 and the polishing pad 16 grows, a displacement amount of the carrier 24 with respect to the head body 22 in the horizontal direction becomes large; thus, the displacement between the springs 202A and 202B of the parallel springs 202 becomes large (about 2–3 μm). Since the displacement is determined by the differential transformer 204, a detected signal (alternating current voltage signal) with a large oscillation is outputted from the amplifier to the processor 212 as shown in FIG. 7. The processor 212 then calculates the friction force according to the detected signal.

The processor 212 stores beforehand the friction force corresponding to the oscillation of the detected signal, in which the friction force corresponding to the oscillation is read out when the detected signal is inputted, and the friction force is outputted to the control device 210 as a calculated value. The control device 210 also stores beforehand the friction force (oscillation A1 in FIG. 7) indicating that the polishing pad 16 needs dressing and the friction force (oscillation A2 in FIG. 7) indicating the polishing pad 16 needs to be replaced. The control device 210 automatically determines the times for dressing and replacement of the polishing pad 16 according to the outputted friction force from the processor 212. Therefore, the wafer can be polished while maintaining a polishing rate constant.

In other words, the wafer holding head 200 in the second embodiment determines the force F of the carrier 24 in the horizontal direction as the friction force of the wafer 50 against the polishing pad 16 due to changes in quality of a membrane to be processed (the surface condition), and outputs an end detecting signal for stopping the process or progressing onto the next polishing as the friction force reaches the force of the predetermined membrane quality. Moreover, an amount of polishing pad to be worn out under the dressing pressure and the dressing time is obtained beforehand, whereby a limit of using the polishing pad 16 (its thickness about 1.5 mm) can be predicted.

The processor 212 can also calculate the rotation torque of the carrier 24 applied from the carrier 24 to the parallel springs 202 according to the voltage of the direct current which is rectified by the rectifier smoothing circuit. The processor 212 stores beforehand the rotation torque of the carrier 24 corresponding to the voltage of rectified direct current. The rotation torque corresponding to the voltage of the direct current is read out, and outputted to the control device 210. The control device 210 stores beforehand the rotation torque (voltage V1 in FIG. 7) indicating the polishing end of the wafer 50. The control device 210 automatically determines the end of the polishing amount of the wafer 50 according to the rotation torque outputted from the processor 212.

On the other hand, in a case to dress the polishing pad 16, the dressing pressure and the time change are monitored until the polishing pad returns to its initial state (the initial friction coefficient=friction force), and if the time until the polishing pad is abraded to the thickness limit for use is predicted, exchanging of the polishing pad 16 can be prepared beforehand.

Moreover, in the second embodiment, the parallel springs 202 are applied as the connecting member, the differential transformer 204 for determining the displacement between the parallel springs 202 is applied as the friction force determining device, and the processor 212 calculates the friction force occurring at the wafer 50 and the polishing pad 16 according to the electric signal outputted from the differential transformer 204; therefore, the friction force can be accurately determined with a simple structure. In addition, another friction determining device may be used instead of the differential transformer 204.

In the second embodiment, further, since the springs 202A and 202B of the parallel springs are symmetrically arranged with respect to the central axis of the head body 22 and the carrier 24, and the core 206 is arranged on the central axis, the friction force in the rotation direction of the polishing pad 16 can be received by the central axis of the holding head 200. Therefore, the friction force can be determined accurately compared with determining the friction force at the periphery of the holding head 202.

Figure 8:
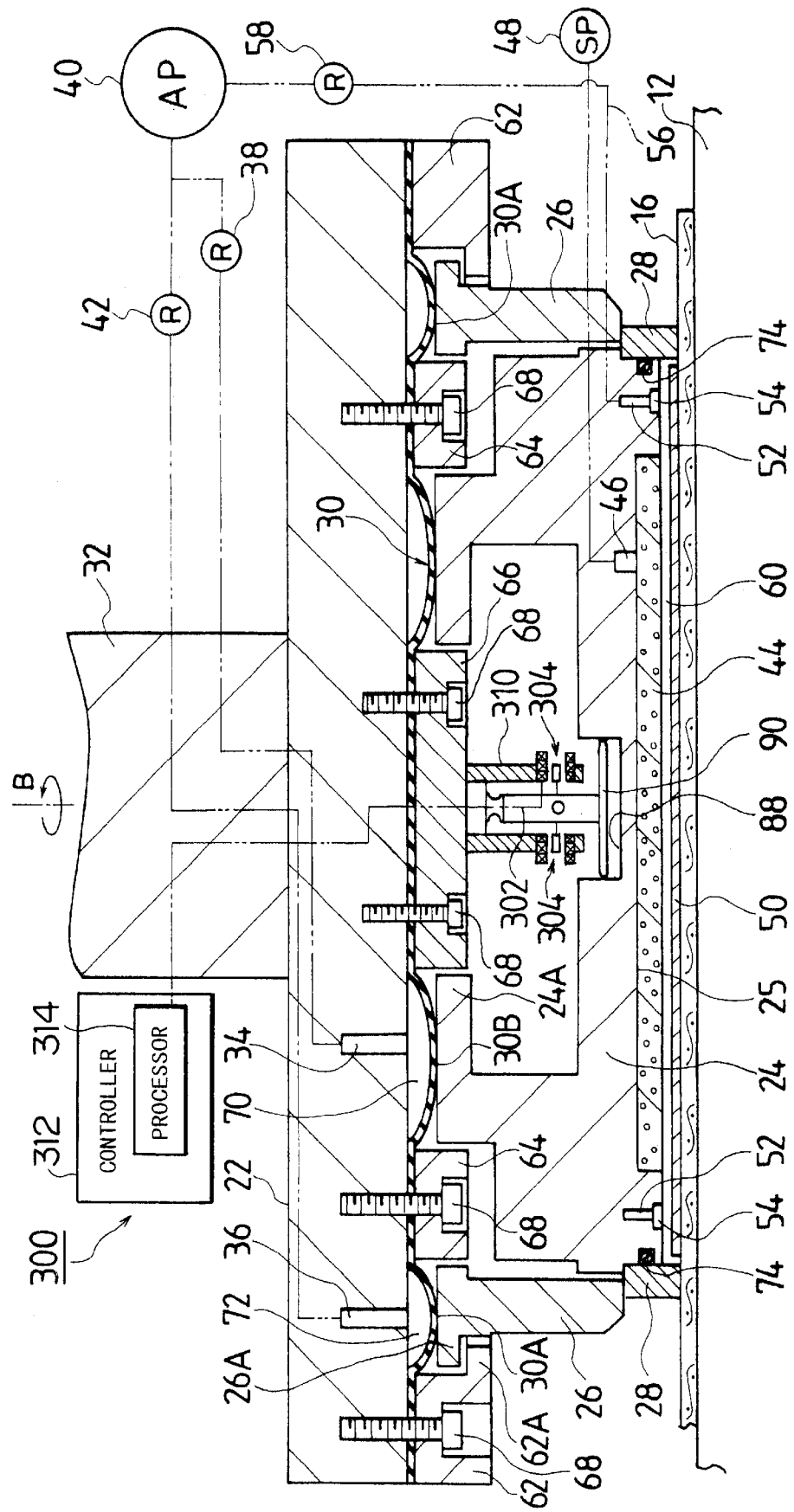
FIG. 8 is a longitudinal view of a wafer holding head in the third embodiment.

FIG. 8 is a longitudinal section view of a wafer holding head 300 in the third embodiment. The same or similar members as the wafer holding head 14 in the first embodiment are assigned the same reference numbers, and explanations for them are omitted.

The wafer holding head 300 has the head body 22 and the carrier 24 connected with each other by a pin 302 to which four differential transformers 304 are attached. A constricted part 303 is formed at the top of the pin 302. As the force F in a horizontal direction is applied to the pin 302, the pin 302 slightly deforms elastically in the horizontal direction with the constricted part 303 as the fulcrum.

Figure 9:
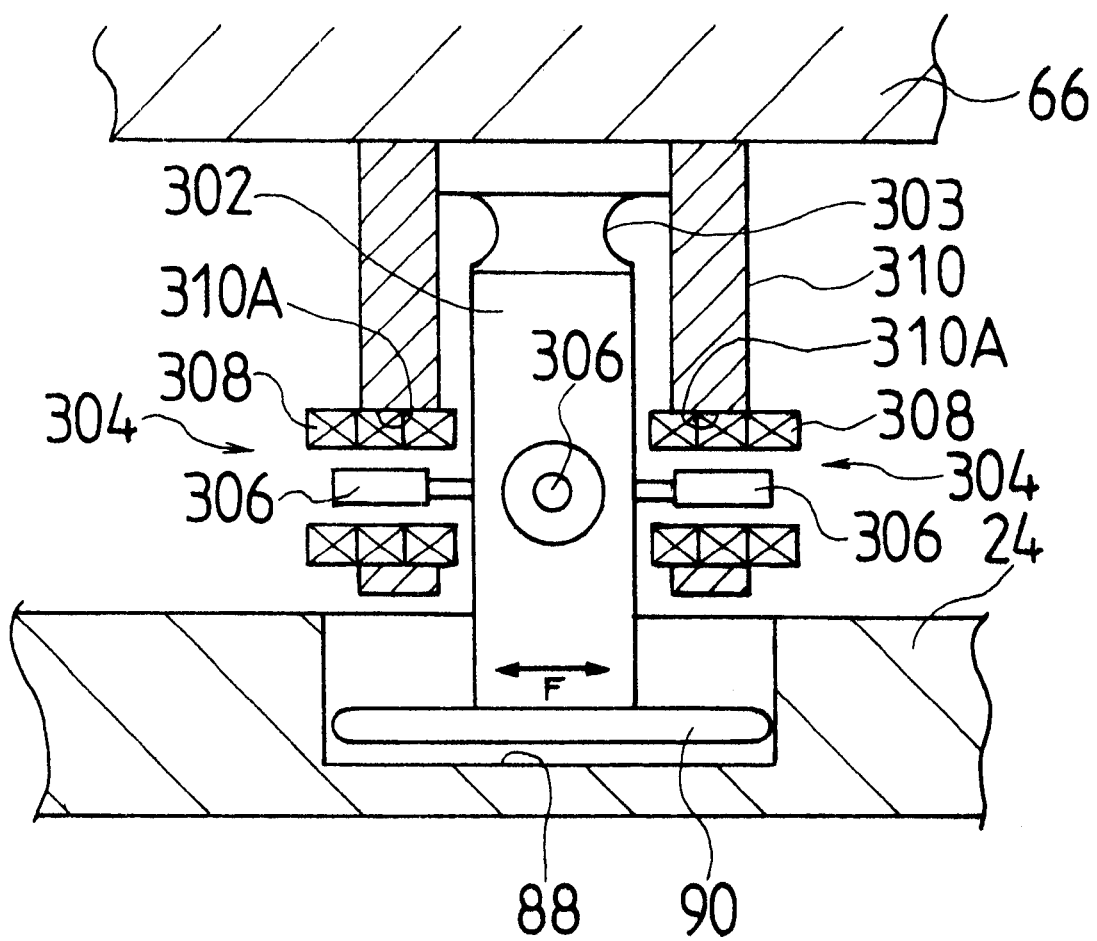
FIG. 9 is an enlarged view of a pin and a differential transformer attached to the wafer holding head in FIG. 8.

As shown in FIG. 9, four cores 306 of the differential transformers 304 are attached to the periphery of the pin 302 with equal intervals in the horizontal direction. Four bobbins 308 of the differential transformers 304 are attached to an opening 310A with equal intervals in the horizontal direction. The opening 310A is formed to a cylinder body 310 forming the exterior of the pin 302. The top of the cylinder body 310 is fixed to the fixing metal 66, its bottom end part left free.

Electric signals, outputted from the four differential transformers 304 are outputted respectively to a control device 312 arranged outside the wafer holding head 300 in FIG. 8. The control device 312 has an amplifier (not shown) for amplifying the electric signals, and a processor 314 for calculating the friction force occurring at the wafer 50 and the polishing pad 16 according to the amplified electric signals. The control device 312 also has a rectifier smoothing circuit (not shown) for rectifying the amplified electric signals.

In the embodiment of the present invention, the four differential transformers 304 are provided, and alternating voltages whose phases are shifted by 90° are applied to the differential transformers 304. Thus an oscillation and a voltage can be detected at ¼ rotation of the wafer holding head 300, thus a sampling time can be subdivided. In the embodiment, the four differential transformers 304 are provided. The number of the differential transformers is not to be limited by four; one differential transformer may be used. However considering subdividing the sampling time, two or more would be preferred.

Furthermore, in the third embodiment, the pin 302 which can elastically deform is applied as the connecting member and the differential transformers 304 are applied as the friction force determining device, and the processor 314 calculates the friction force occurring at the wafer 50 and the polishing pad 16 according to the electric signals outputted from the differential transformers 304; therefore, the friction force can be accurately determined with a simple structure.

As explained above, according to the present invention, the head body and the carrier of the holding head are connected with each other by the connecting member to which the torque determining device or the friction force determining device is provided; thus the friction force can be accurately determined. Therefore, a timing for dressing and a polishing rate can be predicted by the difference in the friction force of the wafer and the platen compared with the beginning of polishing can be predicted, and thus the polishing end can be accurately detected.

Moreover, duration of the platen can be predicted by the change in the friction force of the wafer and the platen after dressing.

Further, since the retainer ring is mounted to the outer periphery of the carrier via the buffer, the wafer can be prevented from damages caused by the impact at contacting of the wafer to the retainer ring, and since the retainer ring is mounted to the carrier without a gap, the outer periphery of the wafer is enclosed by the retainer ring and the wafer can be polished in a state where its center is held on the central axis of the carrier. Therefore, the present invention can improve the polishing precision of the wafer.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A wafer polishing apparatus, comprising:
    a platen which rotates;
    a holding head which holds a wafer and presses the wafer against the platen to polish the wafer, the holding head comprising
        a head body which is rotated and arranged to face the platen,
        a carrier which is arranged below the head body and holds the wafer at its bottom face,
        a connecting member which connects the head body with the carrier and transmits a rotation force from the head body to the carrier, and
        a torque determining device which is provided to the connecting member and determines a rotation torque of the carrier applied from the carrier to the connecting member; and
    a polishing amount determining device which determines a polishing amount of the wafer according to the rotation torque determined by the torque determining device.

2. The wafer polishing apparatus as defined in claim 1, wherein the torque determining device comprises:
    a strain measuring device which measures strain of the connecting member; and
    a processor which calculates the rotation torque of the carrier according to the strain measured by the strain measuring device.

3. The wafer polishing apparatus as defined in claim 2, wherein the strain measuring device comprises a strain gage.

4. The wafer polishing apparatus as defined in claim 1, wherein the connecting member is arranged on a central axis of the head body and the carrier.

5. A wafer polishing apparatus, comprising:
    a platen which rotates;
    a holding head which holds a wafer and presses the wafer against the platen to polish the wafer, the holding head comprising
        a head body which is rotated and arranged to face the platen,
        a carrier which is arranged below the head body and holds the wafer at its bottom face,
        a connecting member which connects the head body with the carrier and transmits a rotation force from the head body to the carrier, and
        a friction force determining device which is provided to the connecting member and determines a friction force in a rotation direction of the platen which occurs at the wafer and the platen and is applied from the carrier to the connecting member; and
    a controller which controls wafer polishing according to a change in the friction force determined by the friction force determining device.

6. The wafer polishing apparatus as defined in claim 5, wherein:
    the connecting member comprises parallel springs; and
    the friction force determining device comprises
        a measuring device which measures a displacement between the parallel springs, and
        a processor which calculates the friction force according to the displacement.

7. The wafer polishing apparatus as defined in claim 6, wherein the measuring device comprises a differential transformer including a core and a bobbin.

8. The wafer polishing apparatus as defined in claim 5, wherein:
    the connecting member elastically deforms by the friction force; and
    the friction force determining device comprises
        a determining device which determines an amount of elastic deformation of the connecting member, and
        a processor which calculates the friction force according to the amount of elastic deformation.

9. The wafer polishing apparatus as defined in claim 8, wherein the determining device comprises a differential transformer including a core and a bobbin.

10. The wafer polishing apparatus as defined in claim 5, wherein the connecting member is arranged on a central axis of the head body and the carrier.

* * * * *